United States Patent
Somasekhar et al.

(10) Patent No.: US 6,721,222 B2
(45) Date of Patent: Apr. 13, 2004

(54) NOISE SUPPRESSION FOR OPEN BIT LINE DRAM ARCHITECTURES

(75) Inventors: Dinesh Somasekhar, Hillsboro, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/300,398

(22) Filed: Nov. 19, 2002

(65) Prior Publication Data

US 2003/0072172 A1 Apr. 17, 2003

Related U.S. Application Data

(62) Division of application No. 09/690,513, filed on Oct. 17, 2000, now Pat. No. 6,496,402.

(51) Int. Cl.[7] .................................................. G11C 7/02
(52) U.S. Cl. ........................ 365/210; 365/208; 365/207; 365/206
(58) Field of Search ................................ 365/210, 208, 365/207, 206, 149, 190

(56) References Cited

U.S. PATENT DOCUMENTS 6,496,402 B1 * 12/2002 Somasekhar et al. ......... 365/63

OTHER PUBLICATIONS

PCT Search Report PCT/US01/31159 dated Jan. 23, 2003, 6 pages.

* cited by examiner

Primary Examiner—Andrew Q. Tran
(74) Attorney, Agent, or Firm—Blakely, Sokoloff, Taylor & Zafman LLP

(57) ABSTRACT

An open bit line dynamic random access memory (DRAM) architecture uses a multiple layer bit line configuration to reduce coupling between switching bit lines in the device. In one approach, each successive cell within a row of DRAM cells is coupled to a bit line segment that is on a different metallization layer than a previous cell in the row. Shielding members are also provided between adjacent bit lines on a common metallization layer to further reduce noise coupling. Functionality is also provided for reducing the effect of word line to bit line coupling in the DRAM device using dummy signal injection techniques. In this manner, common mode noise that could otherwise saturate one or more sense amplifiers within the DRAM device is reduced or eliminated before such saturation can take place. In one approach, dummy cells and reference cells are provided for use in performing the signal injection. The principles of the present invention are particularly well suited for use within embedded DRAM structures where low charge storage capacity within individual cells reduces the signal voltage levels that are achievable.

7 Claims, 4 Drawing Sheets

NOISE SUPPRESSION FOR OPEN BIT LINE DRAM ARCHITECTURES

This is a divisional of application Ser. No. 09/690,513, filed on Oct. 17, 2000, now U.S. Pat. No. 6,496,402.

FIELD OF THE INVENTION

The invention relates generally to semiconductor memories and, more particularly, to noise suppression techniques for use therein.

BACKGROUND OF THE INVENTION

Dynamic random access memories (DRAM) are the semiconductor storage devices of choice for maximizing the number of data bits stored per unit surface area on a chip. A typical 1T DRAM cell includes only a single MOS access transistor and a corresponding storage capacitor. In contrast, a static RAM cell includes between 4 and 6 MOS devices. During DRAM cell operation, the storage capacitor holds one level of charge to represent a "logic one" and another level of charge to represent a "logic zero." The access transistor is used to controllably couple the storage capacitor to a bit line during read and/or write operations.

It is often desirable to embed a DRAM storage device within logic circuitry to provide high-density, on-chip storage capabilities for the logic circuitry. In such a system, it is preferable that the DRAM storage device be implemented within the logic with little or no change in the logic process. It is difficult, however, to achieve a good, high capacity DRAM storage capacitor within an embedded DRAM device without changing the logic process. For example, the storage capacity of planar storage cells in embedded DRAMs is usually between 1 and 5 femtofarads (fF) as opposed to conventional cells having capacities between 15 and 20 fF. In addition, because of their physical dimensions, these capacitors have a limited range of voltages that can be impressed upon them. The small capacity and limited voltage range of these structures limits the overall voltage swing that can be developed using these capacitors during DRAM operation. Because of the low voltage swing associated with embedded DRAMs, noise is more of a problem in these devices. The two greatest sources of noise in DRAM devices are (a) bit line to bit line noise coupling and (b) word line to bit line noise coupling. Word line to bit line coupling is especially large in embedded DRAMs because of the greater gate to source overlap coupling in the access transistors of these devices.

As is well known in the art, an open bit line architecture is capable of achieving a significantly greater cell density than the more commonly used folded bit line architecture. For example, use of an open bit line architecture can increase cell density up to 100 percent or more over the folded bit line approach. Therefore, to achieve a maximum cell density, the open bit line approach is preferred. However, the open bit line architecture is more susceptible to bit line to bit line noise due to the closer proximity of the switching bit lines within the structure. As described above, this increased noise can be especially damaging in embedded DRAM devices.

Therefore, there is a need for an open bit line DRAM architecture that is capable of low noise operation. Preferably, the architecture will be capable of implementation within an embedded DRAM structure with little or no change to the logic process.

DETAILED DESCRIPTION

Figure 2:
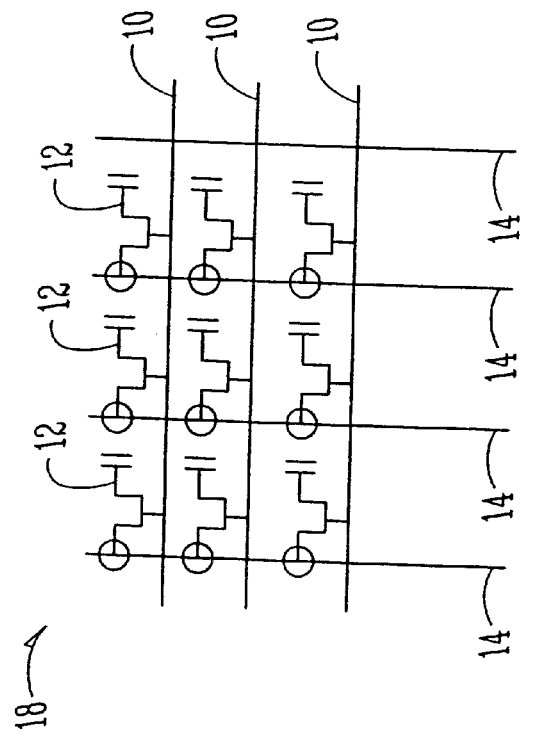
FIGS. 1 and 2 are schematic diagrams illustrating two alternative bit line architectures that can be used within a dynamic random access memory (DRAM) device.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the fill range of equivalents to which the claims are entitled. In the drawings, like numerals refer to the same or similar functionality throughout the several views.

The present invention relates to an open bit line dynamic random access memory (DRAM) architecture that is capable of low noise operation. The architecture uses a multi-layer bit line configuration that significantly reduces bit line to bit line noise generation within the open bit line structure. In addition, circuitry is provided for injecting noise cancellation signals onto the bit lines of the device to reduce or eliminate the effects of word line to bit line noise. Because the architecture is capable of low noise operation, it is ideal for use in embedded DRAMs where noise can have a particularly deleterious effect. The architecture can also be used in any other memory application requiring high density, low noise operation.

Figure 1:
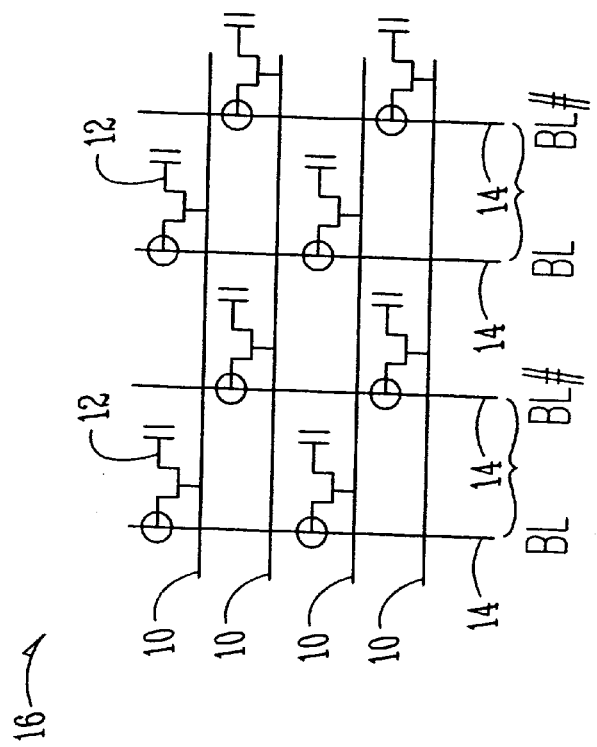

FIGS. 1 and 2 are schematic diagrams illustrating two alternative architectures that can be used within a DRAM device; namely, the folded bit line architecture 16 and the open bit line architecture 18, respectively. As illustrated, each of the architectures 16, 18 includes a plurality of word lines 10 and a plurality of bit lines 14 arranged in an orthogonal configuration. Each architecture 16, 18 also includes a plurality of memory cells 12 that are each capable of storing a single bit of digital data. Each memory cell 12 is associated with one of the word lines 10 and one of the bit lines 14 within the corresponding architecture. The operation of each of the illustrated memory architectures 16, 18 is similar. Data is written to or read from the memory in multi-bit data words. Each row of cells 12 in the memory is used to store a single data word. Thus, the number of cells 12 within a row is equal to the number of bits within a data word. The cells 12 within a particular row are each coupled to a common word line 10 that is used to enable the cells 12 when a data word is to be read from the row (i.e., during a read operation) or written to the row (i.e., during a write operation). When a word line 10 is pulsed during a read or write operation, an access transistor within each of the cells 12 associated with that word line 10 is turned "on," thus coupling a storage capacitor within the cell 12 to a corresponding bit line 14. During a write operation, a controller switches the voltage on the bit line 14 associated with the cell 12 to a value that will store a level of charge within the storage capacitor of the cell 12 that is representative of a data bit value to be stored in the cell 12. During a read operation, the charge currently stored within the storage capacitor of the cell 12 is allowed to modify the voltage on the corresponding bit line 14 to reflect the data bit value currently stored by the cell 12. The term "switching bit line" will be used herein to denote a bit line that is currently undergoing voltage changes due to the performance of a read or write operation.

As illustrated in FIG. 1, the folded bit line architecture 16 includes one memory cell 12 for every other bit line 14 crossing a particular word line 10. Therefore, when a word line 10 is pulsed during a read or write operation, every other bit line 14 in the memory will be a switching bit line. Consequently, there is always a "non-switching" bit line between each pair of switching bit lines during read and write operations. In contrast, the open bit line architecture 18 of FIG. 2 includes one memory cell 12 for each bit line 14 crossing a particular word line 10. In the open bit line architecture 18, therefore, switching bit lines are much closer to one another during read and write operations than in the folded bit line approach, and there is no intervening non-switching bit line. As can be appreciated, use of the open bit line architecture 18 will typically result in much greater bit line to bit line noise coupling than use of the folded bit line architecture 16. However, as is apparent from FIGS. 1 and 2, the open bit line architecture 18 is capable of achieving a significantly greater cell density than the folded bit line architecture 16. Therefore, when cell density is of primary concern, the open bit line architecture is preferred.

In accordance with one aspect of the present invention, an open bit line DRAM device having reduced bit line to bit line noise coupling is provided. A multi-layer metallization scheme is used to provide enhanced isolation between switching bit lines in the device with little or no increase in average cell area. In one embodiment, the inventive principles are implemented within a DRAM device that is embedded within logic circuitry and thus takes advantage of the multiple metallization layers commonly available within such logic devices. The DRAM structures can thus be added to the logic circuitry with little or no change to the logic process.

Figure 3:
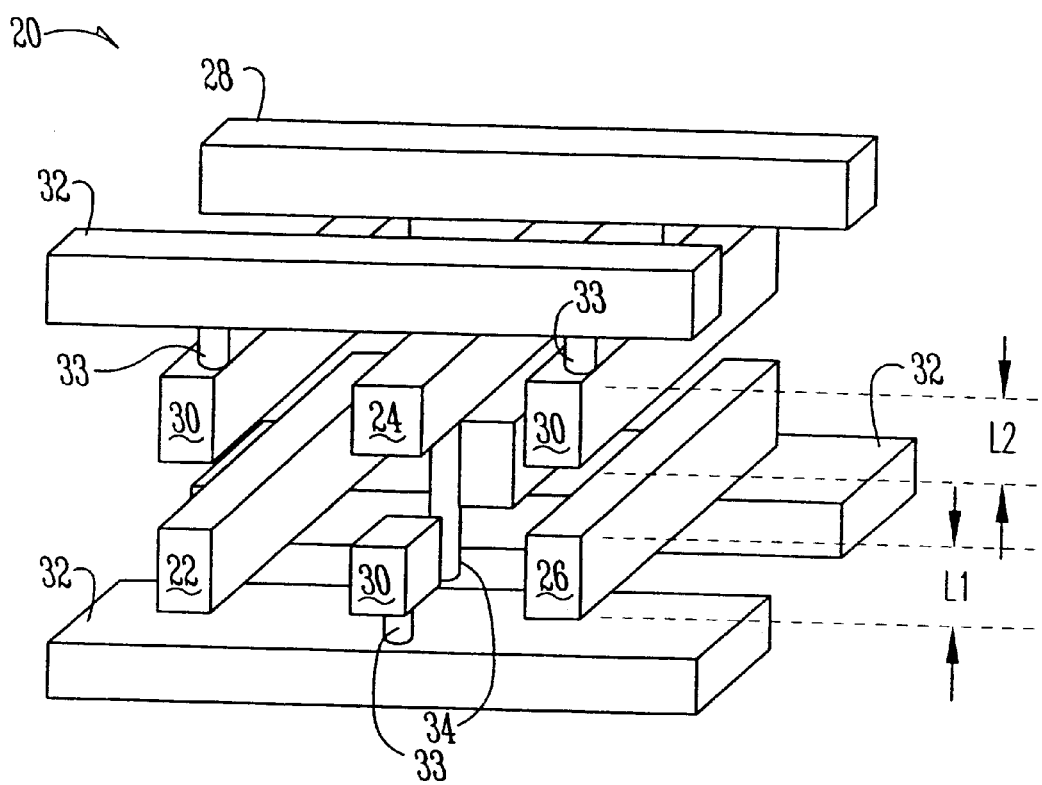
FIG. 3 is a perspective view illustrating a multi-layer bit line configuration in accordance with one embodiment of the present invention.

FIG. 3 is a perspective view illustrating a multi-layer bit line configuration 20 in accordance with one embodiment of the present invention. Although not shown, the multi-layer bit line configuration 20 is situated above an underlying semiconductor substrate having an array of memory cells arranged thereon. For convenience, intervening insulation layers are not shown in the figure. As illustrated, the configuration 20 includes multiple bit lines 22, 24, 26 that are divided between two different metallization layers L1, L2 within the DRAM device. Each of the bit lines 22, 24, 26 is coupled to a corresponding column of memory cells within the underlying substrate in an open bit line configuration, similar to the one illustrated in FIG. 2. The bit lines 22, 24, 26 are coupled to the memory cells using via connections 34 in a relatively well known manner. As illustrated in FIG. 3, each successive bit line 22, 24, 26 in the multi-layer bit line configuration 20 occurs on a different metallization layer (L1, L2) than a previous bit line. Thus, even though an open bit line configuration is being implemented, the noise coupling between adjacent switching bit lines will be significantly reduced. In addition, shielding members 30 are placed between the bit lines on a common metallization layer (e.g., bit lines 22 and 26 on layer L1) to further reduce inter bit line coupling. In one approach, the shielding members 30 are coupled to grounded shield lines 32 on one or more additional metallization layers using via connections 33. Alternatively, the shield members 30 can be tied to ground in some other fashion (e.g., using conductive structures on the same metallization layer) or they can be left ungrounded. A word line 28 is provided on a different metallization layer from the bit lines 22, 24, 26 in the illustrated embodiment. The word line 28 is coupled to corresponding cells (not shown) using, for example, via connections.

Figure 4:
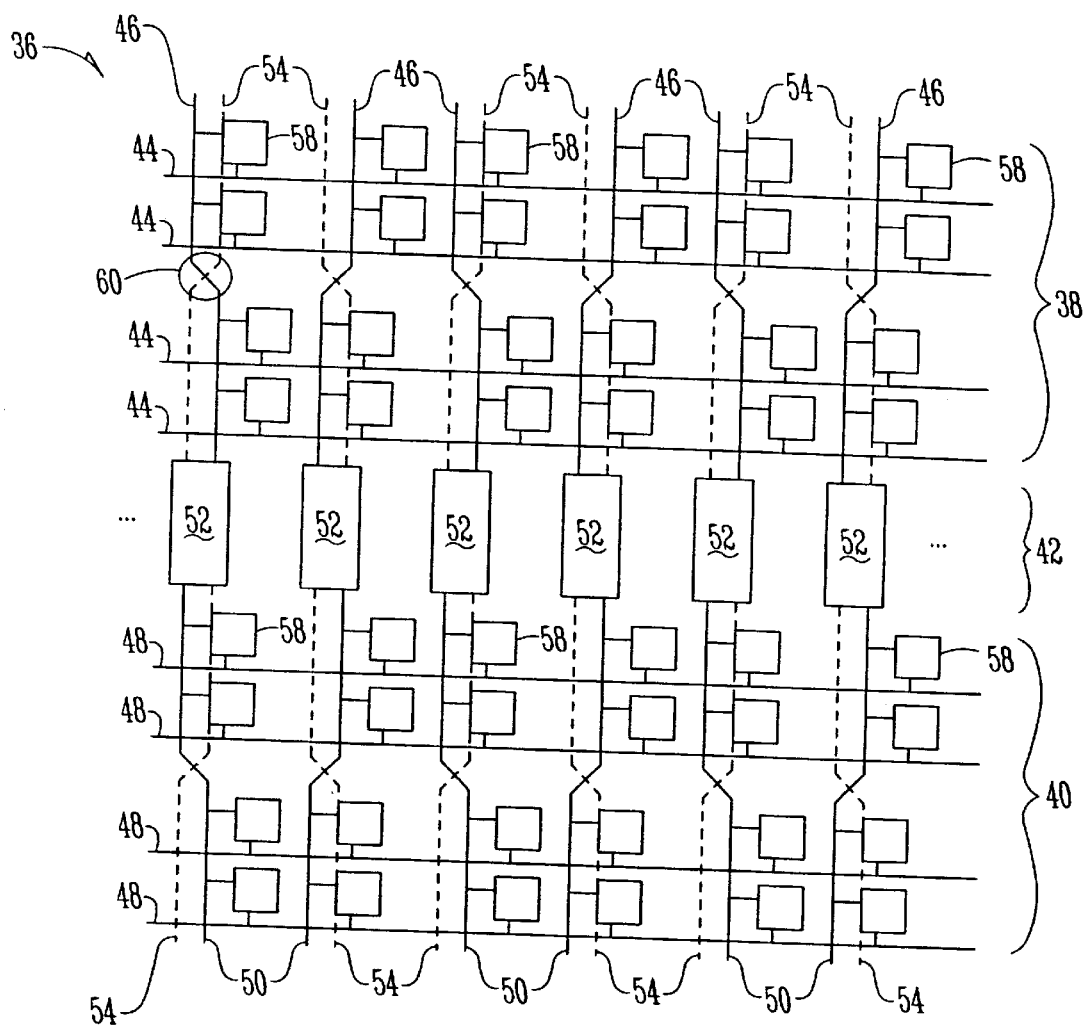
FIG. 4 is a top view illustrating a DRAM architecture that uses a bit line twisting technique to equalize the loading of the bit lines in accordance with one embodiment of the present invention.

A problem that arises by using the multi-layer bit line configuration 20 of FIG. 3 is that different bit lines within the device display different loading characteristics based on, among other things, their distance from the substrate. FIG. 4 is a top view illustrating a DRAM device architecture 36 in accordance with one embodiment of the present invention that uses a bit line twisting technique to equalize the loading of the bit lines. As illustrated, the DRAM architecture 36 includes a first array of cells 38, a second array of cells 40, and a bank of differential sense amplifiers 42. The first array 38 includes a number of memory cells 58 arranged in a plurality of rows and columns, where each row of cells is coupled to a common word line 44 and each column of cells is coupled to a common bit line 46. Similarly, the second array 40 includes a number of memory cells 58 arranged in a plurality of rows and columns, where each row of cells is coupled to a common word line 48 and each column of cells is coupled to a common bit line 50. Each differential sense amplifier 52 in the bank of sense amplifiers 42 is coupled to one of the bit lines 46 in the first array of cells 38 and one of the bit lines 50 in the second array of cells 40. As will be discussed in greater detail, the differential sense amplifiers 52 are operative for comparing the voltages on the two associated bit lines 46, 50 during read operations to determine a data value stored in a corresponding memory cell.

As illustrated in FIG. 4, each of the bit lines 46, 50 in the first and second cell arrays 38, 40 is associated with a shield member 54 (represented by a dotted line in the figure). As in the bit line configuration of FIG. 3, the shield member 54 is located on a different metallization layer than the corresponding bit line 46, 50, either above or below the bit line 46, 50. In FIG. 4, for a given bit line/shield member pair, the right side represents the lower metallization layer (e.g., L1 in FIG. 3) and the left side represents the upper metallization layer (e.g., L2 in FIG. 3). As shown, each of the bit line/shield member pairs includes a twist 60 at a midpoint along the length of the pair where both the bit line 46, 50 and the shield member 54 transition between metallization layers. For example, a bit line 46 in the first array 38 transitions from the upper metallization layer L2 to the lower metallization layer L1 and the corresponding shield member 54 transitions from the lower metallization layer L1 to the upper metallization layer L2, or vice versa, at the twist 60. In one embodiment, the twists 60 are implemented using vias and adapted metallization patterns. By using twists, the loading presented by each of the bit lines 46, 50 to, for example, the sense amplifiers 52, is substantially the same for all of the bit lines 46, 50 in the DRAM device.

With reference to FIG. 4, each of the cells 58 in the device includes an access transistor and a storage capacitor. The storage capacitor holds an amount of charge that corresponds to a data value being stored by the cell 58. The access transistor acts as a switch that couples the storage capacitor to the associated bit line 46, 50 when a predetermined voltage is placed on the corresponding word line 44, 48. When the storage capacitor is coupled to the bit line 46, 50, a voltage develops on the bit line 46, 50 that is related to the amount of charge stored within the storage capacitor. During a typical read operation, a predetermined voltage is applied to the word line 44, 48 of a row of memory cells 58 storing a data word to be read. The storage capacitor in each of the cells in the row is then coupled to an associated bit line and a corresponding bit line voltage develops. A reference voltage is maintained on each of the bit lines within the other array of cells 40, 38. Each differential sense amplifier 52 then senses the voltages on the corresponding bit lines 46, 50 and amplifies the difference between the voltages. The resulting signals are representative of the data values stored within the row of cells.

When the voltage on a word line 44, 48 is switched between values, switching noise is generally induced into each of the bit lines 46, 50 associated with the word line 44, 48. The word line to bit line noise generally occurs through two principle mechanisms; namely, (a) coupling between the lines themselves at the cross point of the lines and (b) coupling via an overlap capacitance between the gate and the drain of the access transistor within the corresponding memory cell. The overlap capacitance noise mechanism becomes especially troublesome in embedded DRAM devices that utilize very thin oxide layers. As discussed above, during a read operation, a word line corresponding to a row of cells is switched between two values. Thus, a noise component appears on each bit line associated with the word line. Because a word line voltage is switched in only one of the two cell arrays 38, 40, the induced noise appears as differential noise to the differential sense amplifiers 52. As can be appreciated, this differential noise can compromise the performance of the differential sense amplifiers 52, particularly in devices using low voltage levels (e.g., embedded DRAM structures).

In accordance with one aspect of the present invention, a row of reference cells is defined in each of the first and second cell arrays 38, 40 to store a reference charge for each corresponding bit line to be used for comparison during read operations. The magnitude of the reference charge is somewhere between the nominal magnitude representative of a logic zero and the nominal magnitude representative of a logic one. During a read operation, the voltage on the word line associated with the row of cells being read is switched as before. At substantially the same time, the voltage on the word line of a row of reference cells within the other cell array 38, 40 is also switched. The sense amplifiers 52 then compare the resulting voltages on the corresponding bit lines 46, 50. Because a word line voltage has been switched in both the first and second array of cells 38, 40, a common mode noise signal develops across the differential sense amplifiers 52 that should be rejected thereby.

Because the bit lines 46, 50 in the DRAM architecture 36 of FIG. 4 occur on two different metallization layers, the amount of word line to bit line noise that appears on a bit line will generally depend upon the layer on which the bit line rests at the crossover point with the word line. For example, with reference to FIG. 3, bit lines located within the upper metallization layer L2 will generally couple with word line 28 more tightly than bit lines located within the lower metallization layer L1. To improve noise signal cancellation during a read operation, therefore, the reference cell that is used for comparison with a particular memory cell during a read operation should be coupled to a bit line segment that is on the same metallization layer as the bit line segment coupled to the memory cell. In this manner, the magnitudes of the induced noise on the two corresponding bit lines will be substantially the same and will cancel more effectively in the differential amplifier 52. To achieve this, a row of reference cells is provided for each possible bit line configuration in both the first and second array of cells 38, 40. For example, a first row of reference cells would include: (a) a first cell coupled to a bit line segment in the lower metallization layer L1, (b) a second cell coupled to a bit line segment in the upper metallization layer L2, (c) a third cell coupled to a bit line segment in the lower metallization layer L1, and so on. A second row of reference cells would include: (a) a first cell coupled to a bit line segment in the upper metallization layer L2, (b) a second cell coupled to a bit line segment in the lower metallization layer L1, (c) a third cell coupled to a bit line segment in the upper metallization layer L2, and so on. During a read operation, a row of reference cells is selected that has the same bit line configuration as the row of memory cells being read.

Figure 5:
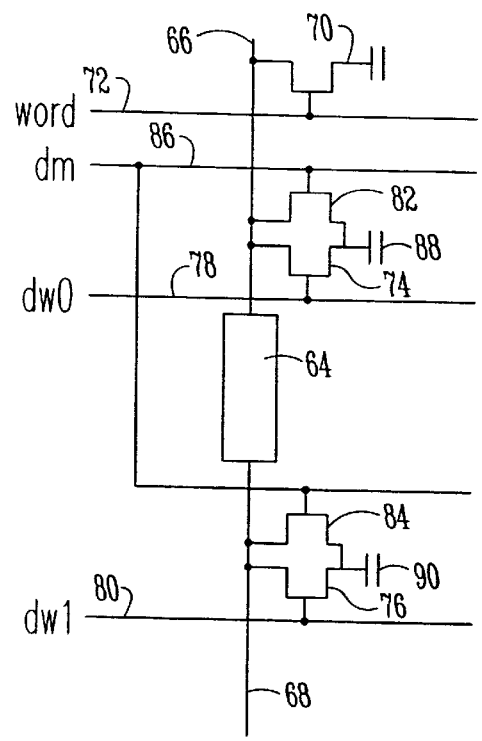
FIG. 5 is a schematic diagram illustrating circuitry for performing noise reducing signal injection in accordance with one embodiment of the present invention.

As described above, the common mode word line to bit line noise that results from using a reference cell approach should cancel within each differential sense amplifier 52. However, if the common mode noise is large enough, it could saturate the sense amplifiers 52, thus compromising the sensing process. Some types of sense amplifier (e.g., the simple cross-coupled inverter type sense amplifiers that are commonly used in DRAM devices) are particularly prone to saturation. In another aspect of the present invention, therefore, a noise canceling signal injection technique is provided for reducing or eliminating the word line to bit line noise before it can saturate the sense amplifiers 52. FIG. 5 is a schematic diagram illustrating circuitry for performing noise reducing signal injection in accordance with one embodiment of the present invention. As illustrated, a differential sense amplifier 64 is coupled to a first bit line 66 and a second bit line 68 for comparing voltages thereon. A standard DRAM memory cell 70 is coupled to the first bit line 66 and to a word line 72. Although not shown, a number of additional DRAM memory cells will also typically be coupled to each of the bit lines 66, 68. At least one reference cell 74, 76 is coupled to each of the bit lines 66, 68 and to corresponding word lines (dw0 and dw1) 78, 80. In addition, at least one dummy cell 82, 84 is coupled to each of the bit lines 66, 68. The dummy cells 82, 84 are each tied to a common word line (dm) 86. As shown, each dummy cell 82, 84 shares a common storage capacitor 88, 90 with an associated reference cell 74, 76. The reference cells 74, 76 and dummy cells 82, 84 each operate in substantially the same fashion as the DRAM memory cell 70.

Figure 6:
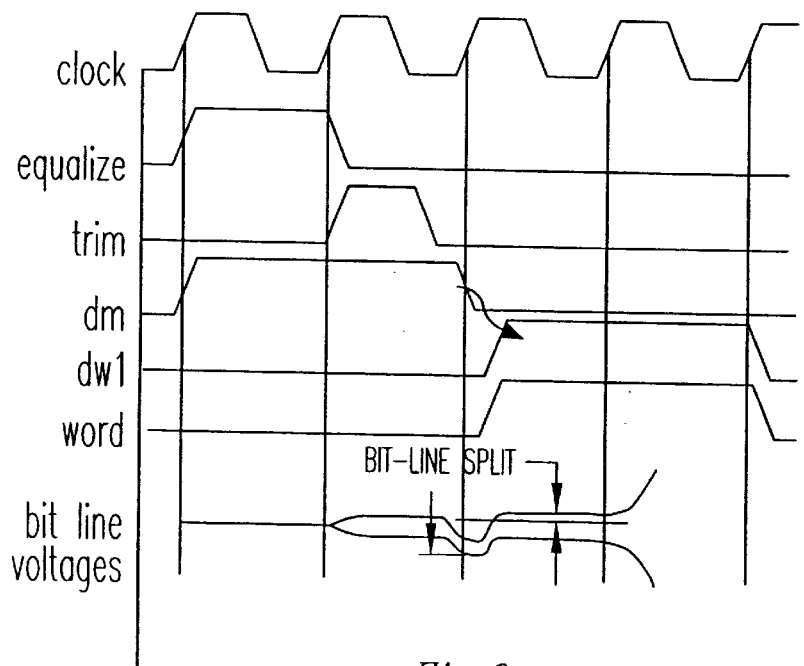
FIG. 6 is a timing diagram including a series of waveforms that illustrate the operation of the circuitry of FIG. 5 during a read operation.

FIG. 6 is a timing diagram including a series of waveforms that illustrate the operation of the circuitry of FIG. 5 during a read operation involving the DRAM memory cell 70. At the beginning of the operation, the "equalize" and "trim" signals are fired in rapid succession. The "equalize" signal sets each of the bit lines 66, 68 to a mid-point voltage (e.g., Vcc/2) to support operation of the sense amplifier 64. The "trim" signal is used to trim any offsets in the sense amplifier 64. Sometime during the "equalize" or "trim" pulse, the dm signal is fired to activate the access transistors of the two dummy cells 82, 84. Consequently, the storage capacitors 88, 90 of the dummy cells 82, 84 charge up to the present voltage value on the corresponding bit lines 66, 68. Subsequently, the dm signal is turned off. A short time thereafter, the word line 72 associated with memory cell 70 and the dw1 line 80 associated with reference cell 76 are fired at substantially the same instant. Because the reference cell 76 shares a storage capacitor 90 with the dummy cell 84, the voltage stored in the capacitor 90 is coupled to the bit line 68.

As shown in FIG. 6, by turning off the dm signal shortly before firing the two word lines 72, 80, a cancellation signal is injected into each of the bit lines 66, 68 (i.e., via the word line to bit line noise mechanisms) that reduces the voltage on each bit line 66, 68 by a predetermined amount. The subsequent firing of the two word lines 72, 80 then increases the voltage on the two bit lines 66, 68 by the same or a similar amount, via the same noise mechanism, thus resulting in a significant reduction or cancellation of the induced noise component on the bit lines 66, 68. More specifically, the noise component injected onto the upper bit line 66 when the dm signal transitions from a high value to a low value cancels the noise component subsequently injected onto the upper bit line 66 when the signal on the word line 72 transitions from a low value to a high value. Similarly, the noise component injected onto the lower bit line 68 when the dm signal transitions from a high value to a low value cancels the noise component injected onto the lower bit line 68 when the signal on the dw1 line 80 subsequently transitions from a low value to a high value. Thus, the overall effect is to reduce or eliminate the word line to bit line noise components on the bit lines 66, 68 and therefore significantly reduce the likelihood of saturating the sense amplifier 64.

As discussed previously, because the bit lines can occur on different metallization layers in accordance with the invention, the amount of word line to bit line noise induced into each bit line 66, 68 will depend upon the layer of each of the bit lines at the cross point with the associated word lines. Accordingly, multiple dummy cells and reference cells can be provided for each bit line 66, 68 to account for different layers. Thus, if the memory cell 70 of FIG. 5 is coupled to a bit line segment on an upper metallization layer, a dummy cell and reference cell can be selected on the other side of the sense amplifier 64 that are coupled to bit line segments on the same metallization layer.

Although the present invention has been described in conjunction with certain embodiments, it is to be understood that modifications and variations may be resorted to without departing from the spirit and scope of the invention as those skilled in the art readily understand. For example, the inventive principles are not limited to the use of two metallization layers for the bit lines in the device. That is, bit line schemes using three or more metallization layers can be implemented. Such modifications and variations are considered to be within the purview and scope of the invention and the appended claims.

What is claimed is:

1. A method for reducing noise during a read operation in a dynamic random access memory (DRAM) device, comprising:

providing a DRAM device having first and second bit lines coupled to a common differential sense amplifier, a memory cell coupled to said first bit line and to a first word line, a reference cell coupled to said second bit line and to a second word line, a first dummy cell coupled to said first bit line and a third word line, and a second dummy cell coupled to said second bit line and a fourth word line;

activating said first and second dummy cells using said third and fourth word lines;

subsequently deactivating said first and second dummy cells using said third and fourth word lines; and simultaneously activating said memory cell and said reference cell using said first and second word lines.

2. The method claimed in claim 1, wherein:

activating said first and second dummy cells includes changing a signal level on said third and fourth word lines.

3. The method claimed in claim 1, wherein:

subsequently deactivating said first and second dummy cells includes changing a signal level on said third and fourth word lines.

4. The method claimed in claim 1, wherein:

simultaneously activating said memory cell and said reference cell includes changing a signal level on each of the first and second word lines.

5. The method claimed in claim 1, wherein:

subsequently deactivating said first and second dummy cells injects first signals onto said first and second bit lines, said first signals having a first polarity; and simultaneously activating said memory cell and said reference cell injects second signals onto said first and second bit lines, said second signals having a second polarity that is different from said first polarity.

6. The method claimed in claim 5, wherein:

said first signal is approximately equal in magnitude to said second signal for each of said first and second bit lines.

7. The method claimed in claim 1, wherein:

subsequently deactivating said first and second dummy cells is performed just prior to simultaneously activating said memory cell and said reference cell.

\* \* \* \* \*

UNITED STATES PATENT AND TRADEMARK OFFICE
CERTIFICATE OF CORRECTION

PATENT NO. : 6,721,222 B2
DATED : April 13, 2004
INVENTOR(S) : Somasekhar et al.

It is certified that error appears in the above-identified patent and that said Letters Patent is hereby corrected as shown below:

Column 2,
Line 35, delete "fill" and insert -- full --.

Signed and Sealed this

Twentieth Day of July, 2004

JON W. DUDAS
*Acting Director of the United States Patent and Trademark Office*